(12) United States Patent
Way

(10) Patent No.: US 7,477,524 B2
(45) Date of Patent: Jan. 13, 2009

(54) RETAINER AND METHOD FOR HOLDING A CIRCUIT CARD AGAINST A CLAMPING SURFACE OF A CHASSIS OR HEATSINK

(75) Inventor: Richard J. Way, Fort Collins, CO (US)

(73) Assignee: Woodward Governor Company, Fort Collins, CO (US)

( * ) Notice: Subject to any disclaimer, the term of this patent is extended or adjusted under 35 U.S.C. 154(b) by 129 days.

(21) Appl. No.: 11/070,706

(22) Filed: Mar. 2, 2005

(65) Prior Publication Data

US 2006/0198111 A1    Sep. 7, 2006

(51) Int. Cl.
    *H05K 7/14* (2006.01)
(52) U.S. Cl. .................. 361/801; 361/759; 361/826
(58) Field of Classification Search ......... 361/728–732, 361/740, 747, 752, 754, 755, 759, 796–801, 361/826; 174/50
    See application file for complete search history.

(56) References Cited

U.S. PATENT DOCUMENTS

| | | | |
|---|---|---|---|
| 3,231,785 A | 1/1966 | Calabro | |
| 3,714,513 A | 1/1973 | Marconi | |
| 3,950,057 A | 4/1976 | Calabro et al. | |
| 4,022,326 A * | 5/1977 | Marconi | .................. 211/41.17 |
| 4,323,161 A | 4/1982 | Marconi | |
| 4,775,260 A | 10/1988 | Keemer | |
| 4,785,379 A | 11/1988 | Goodrich | |
| 4,823,951 A | 4/1989 | Colomina | |
| 4,872,853 A * | 10/1989 | Webster | ..................... 439/327 |
| 4,909,752 A | 3/1990 | Hallum et al. | |
| 4,916,557 A | 4/1990 | Okamura | |
| 4,953,059 A | 8/1990 | McNulty | |
| 5,170,325 A | 12/1992 | Bentz | |
| 5,290,122 A * | 3/1994 | Hulme | .................... 403/374.4 |
| 5,343,361 A | 8/1994 | Rudy, Jr. et al. | |
| 5,402,319 A | 3/1995 | Shumaker et al. | |
| 5,594,627 A | 1/1997 | Le | |
| 5,910,640 A | 6/1999 | Farnworth et al. | |
| 6,285,564 B1 | 9/2001 | O'Brien | |
| 6,346,003 B1 * | 2/2002 | Vilgiate | ...................... 439/377 |
| 6,970,363 B2 * | 11/2005 | Bassett et al. | ............... 361/801 |
| 2003/0031004 A1 * | 2/2003 | Hooper | ....................... 361/801 |
| 2003/0203678 A1 | 10/2003 | Farnworth et al. | |
| 2006/0114662 A1 * | 6/2006 | Liu et al. | ..................... 361/759 |
| 2007/0163108 A1 * | 7/2007 | Dingfelder et al. | ............ 29/762 |

FOREIGN PATENT DOCUMENTS

GB    2 164 803 A    3/1986

* cited by examiner

*Primary Examiner*—Dean A. Reichard
*Assistant Examiner*—Yuriy Semenenko
(74) *Attorney, Agent, or Firm*—Reinhart Boerner Van Deuren P.C.

(57) ABSTRACT

An improved retainer, apparatus and method for retaining a circuit card are provided, through the use of a circuit card retainer comprising a length of spring wire defining a longitudinal axis of the retainer, lying in a plane of the retainer, and formed to define a wavy section of the retainer having peaks and valleys of the spring wire lying in the plane of the retainer with at least some of the peaks and/or the valleys being offset from the axis of the retainer. Some embodiments include a retainer guide, having a groove therein for properly orienting the wavy section of the retainer with respect to the circuit card.

9 Claims, 5 Drawing Sheets

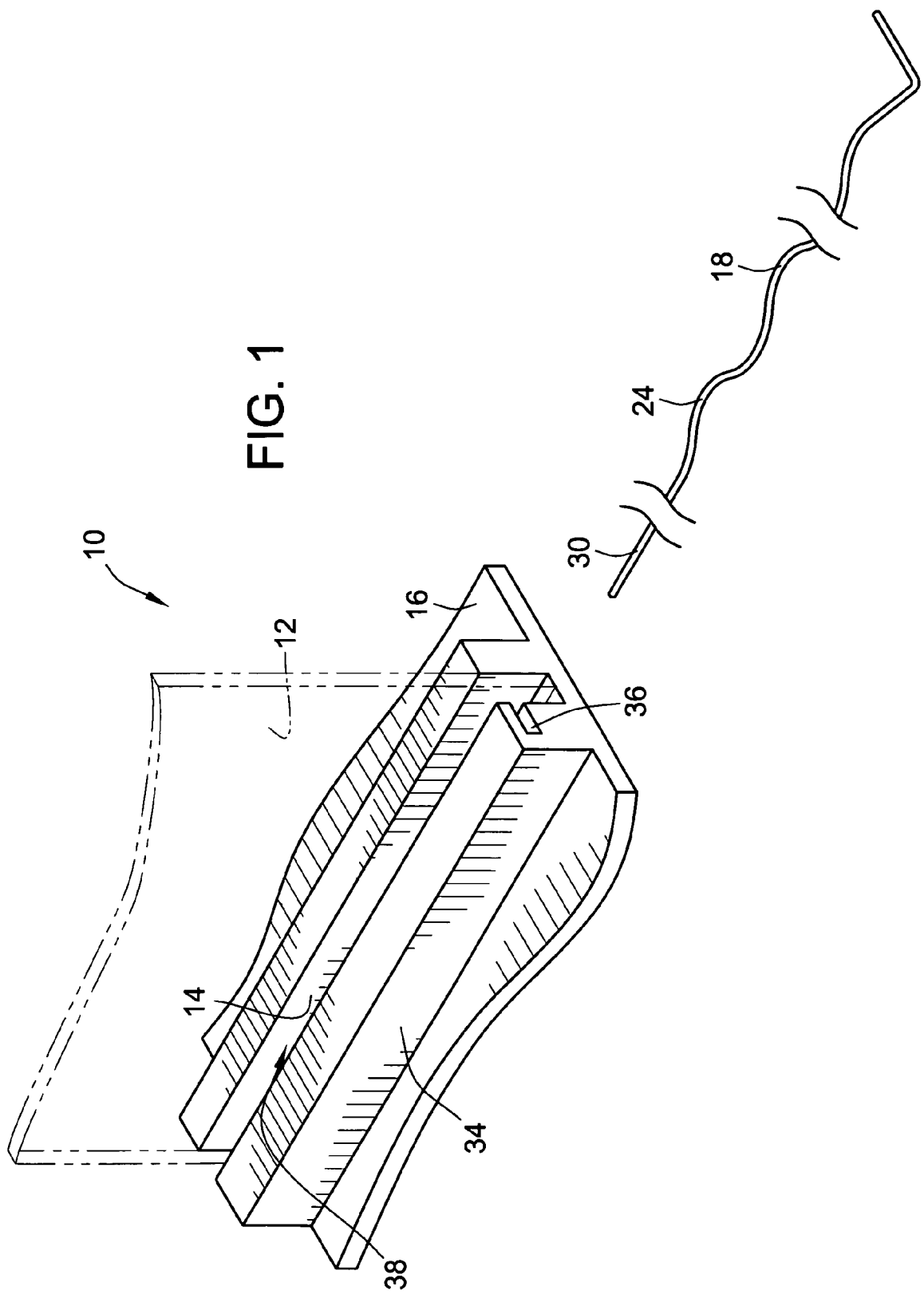

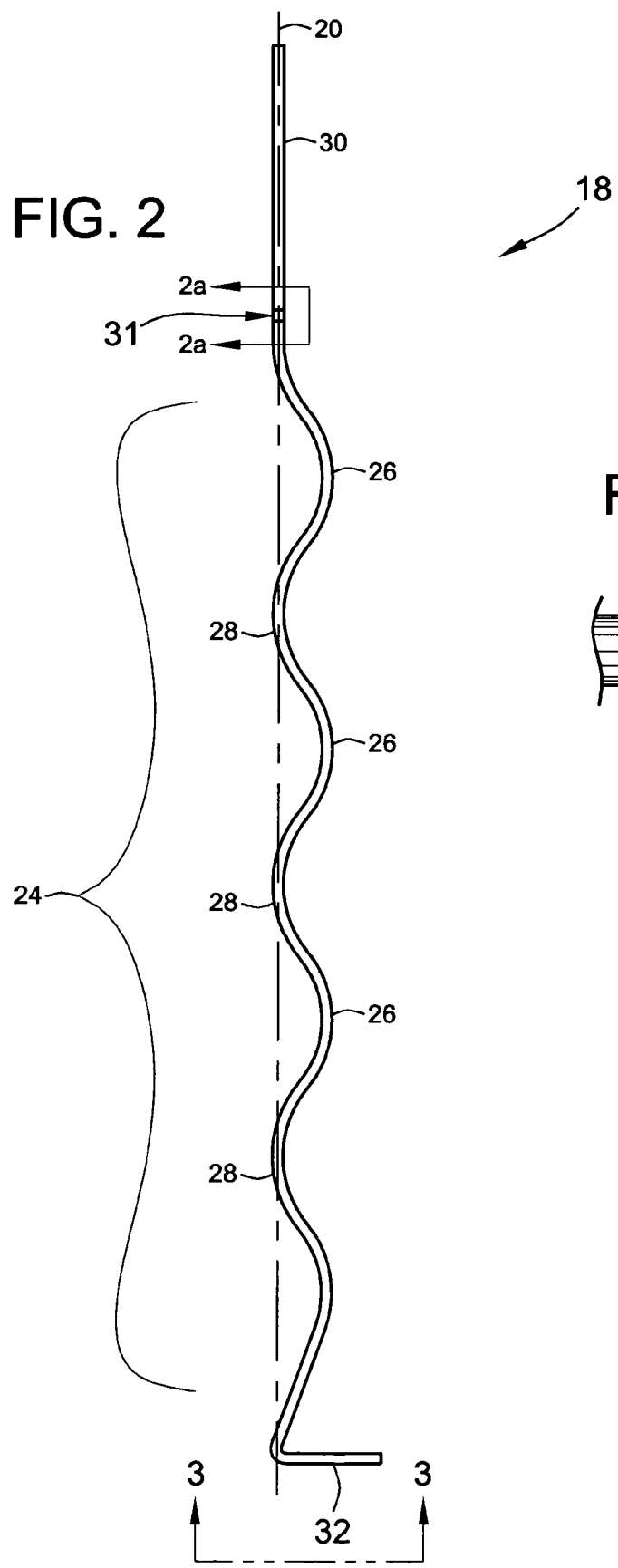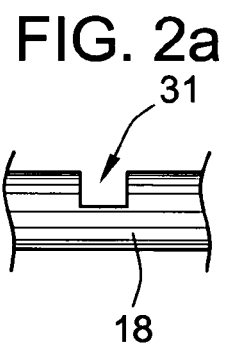

RETAINER AND METHOD FOR HOLDING A CIRCUIT CARD AGAINST A CLAMPING SURFACE OF A CHASSIS OR HEATSINK

FIELD OF THE INVENTION

This invention relates to retaining circuit cards in a chassis, and more particularly to a method and apparatus for clamping a circuit card against a clamping surface of a chassis or a heatsink.

BACKGROUND OF THE INVENTION

Electronic equipment often employs printed circuit boards or cards. These cards typically are mounted in a chassis or card rack by stacking the cards in row alignment with one another. Row alignment in the chassis is defined by slotted or spaced surfaces within or on the chassis, with each card placed in a slot or between a pair of spaced surfaces.

Many applications for such retainers require that the retainer secure a printed circuit card to the chassis under severe shock and vibration conditions. This is particularly true for retainers used to secure circuit cards in equipment for spacecraft, or military aircraft.

In addition, the printed circuit board chassis often does not allow sufficient cooling air or fluid to pass over the circuit board, particularly where the chassis must be sealed from the surrounding environment, or where the chassis is densely packed with circuit components. To provide adequate cooling for components on the circuit card, heat generated on the circuit card is conducted to an edge of the circuit card, through a metal heat sink, inner copper planes, or a heat pipe attached to the circuit card, and then transferred by thermal conduction through the chassis to a heat exchanger or plenum operatively attached to the chassis. In order to achieve the required heat transfer, the edge of the circuit card must be clamped securely by the retainer against a clamping surface, of the chassis or heat sink, with enough force, directed normal to the card, to ensure intimate contact of the edge of the card with the clamping surface of the chassis or heatsink.

In one prior approach to retaining circuit cards, the edge of the card is positioned within a channel between a pair of oppositely facing surfaces. A screw-actuated wedge locking device installed in the channel between one of the surfaces and the card is utilized for forcing the edge of the card into contact with the other surface, to secure the card against movement and to clamp the edge of the card against the clamping surface to facilitate heat transfer from the edge of the card into the clamping surface. Such wedge locking type retainers are sometimes attached to the edge of the circuit card. U.S. Pat. No. 4,823,951 to Colomina, U.S. Pat. No. 5,290,122 to Hulme, and U.S. Pat. No. 6,285,564B1 to O'brien, describe such wedge locking circuit card retainers. Such wedge locking type retainers are also sold under the trade name "series 226 Card-lock" by Calmark Corporation, of San Gabriel Calif., United States of America.

Screw actuated wedge locking retainers have several disadvantages. The mechanism is somewhat complex, given the simple function to be performed, thereby driving up the cost of the retainers and installation into the chassis. The complexity and necessity for angular movement of the wedges makes this type or retainer larger than is desirable in densely packed electronic chasses. The screw must also typically be made of steel or a high strength alloy, which adds undesirable weight. A pair of oppositely facing surfaces on the chassis is also required, thereby adding undesirable complexity to the chassis.

In another prior approach to securing circuit cards in a chassis, retainers having a plurality of leaf spring members have been utilized. One such leaf-spring type retainer is provided under the trade name "Series nw125 and nw126 Card Retainer" by Calmark Corporation of San Gabriel Calif., United States of America. U.S. Pat. Nos. 3,231,785 and 3,950,057 to Calabro disclose other forms of leaf finger spring retainers.

In some forms of prior leaf spring retainers, such as the Series nw125 and nw126 Card Retainers, by Calmark Corporation, one of the opposing surfaces can be eliminated from the chassis by securing the card retainer to the chassis adjacent to the clamping surface. Right and left handed retainers must be provided, however, depending upon the orientation of the clamping surface with respect to the retainer. Such leaf spring retainers must also typically be made of a high strength material such as stainless steel, or beryllium copper, thereby making them heavier than is desirable. Such leaf spring type retainers are also relatively bulky, consuming more package volume than is desirable. The additional steps of riveting or otherwise attaching the retainer to the chassis also add undesirable expenditures of time and cost during fabrication.

It is desirable, therefore, to provide an improved retainer, apparatus, and method for retaining a circuit card against a clamping surface of a chassis or heatsink.

BRIEF SUMMARY OF THE INVENTION

The invention provides an improved retainer, apparatus and method for retaining a circuit card, through the use of a circuit card retainer comprising a length of spring wire, defining a longitudinal axis of the retainer, lying in a plane of the retainer, and formed to define a wavy section of the retainer having peaks and valleys of the spring wire lying in the plane of the retainer, with at least some of the peaks and/or the valleys being offset from the axis of the retainer. The invention may also include a retainer guide, having a groove therein for properly orienting the wavy section of the retainer with respect to the circuit card.

In one form of the invention a circuit card retainer may include a length of spring wire, defining a longitudinal axis of the retainer, lying in a plane of the retainer, and formed to define a wavy section of the retainer having peaks and valleys of the spring wire lying in the plane of the retainer, with at least some of the peaks and/or the valleys being offset from the axis of the retainer. The peaks and valleys may be regularly spaced in the wavy section. The retainer may also include a straight section of the spring wire extending substantially parallel to the axis at one end of the wavy section of the retainer to provide an extension that may be used for pulling the wavy portion in to the groove in the retainer guide. The retainer may further include a stop section of the spring wire, extending substantially perpendicular to the axis at an opposite end of the wavy section of the retainer. The retainer may also incorporate a snap-off constriction, such as notch, so that a portion of the retainer may be snapped-off without the need for using a tool, after the retainer is properly positioned in the groove. The stop section may lie in the plane of the retainer.

The invention may also take the form of an apparatus for retaining a circuit card against a clamping surface with a circuit card retainer comprising a preformed length of spring wire applying a force directed substantially normal to the circuit card and clamping surface. The spring wire may have a cross-sectional dimension, and the apparatus may further include a retainer guide having a groove therein for receiving the retainer, with the groove in the retainer guide having a pair of side walls spaced apart a distance greater than the cross-sectional dimension of the spring wire and extending substantially perpendicular to the circuit card and surface. The retainer guide and clamping surface may define spaced surfaces between which the circuit card is clamped by the retainer. The retainer guide and clamping surface may extend generally perpendicularly outward from a datum surface to define a card receiving channel, with the groove in the retaining guide being configured for orienting the retainer with the plane of the retainer extending substantially parallel to the datum surface.

An apparatus according to the invention may also include a chassis or heat sink forming the clamping surface. The chassis or heatsink may include the retainer guide. The apparatus may further include a circuit card retainer comprising a preformed length of spring wire applying a force directed substantially normal to the circuit card and clamping surface when the retainer is installed in the groove in the retainer guide.

The invention may also take the form of a method for retaining a circuit card against a clamping surface of a chassis or a heatsink, by applying a force directed substantially normal to the circuit card and clamping surface with a circuit card retainer comprising a preformed length of spring wire.

Other aspects, objectives and advantages of the invention will be apparent from the following detailed description and the accompanying drawings.

BRIEF DESCRIPTION OF THE DRAWINGS

FIG. 1 a perspective illustration of a first exemplary embodiment of the invention in the form of an apparatus for retaining a circuit card against a clamping surface with a circuit card retainer comprising a preformed length of spring wire applying a force directed substantially normal to the circuit card and surface.

FIG. 2 is a top view of a circuit card retainer, according to the invention.

FIG. 2a is an enlarged side view, taken along lines 2a-2a of FIG. 2, illustrating a snap-off notch in the circuit card retainer of FIG. 2.

Figure 3:
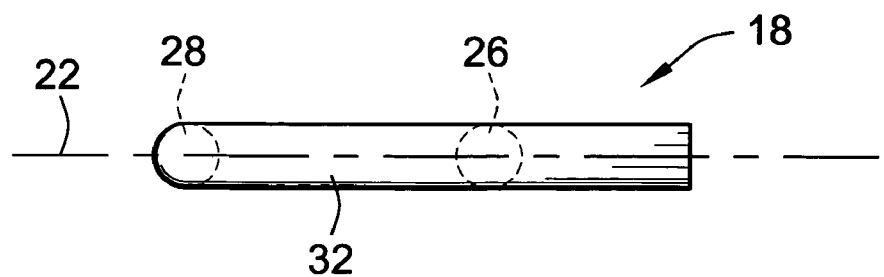
FIG. 3 is an end view of the circuit card retainer of FIG. 2.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

FIG. 1 an exploded perspective illustration of a first exemplary embodiment of the invention in the form of an apparatus 10, for retaining a circuit card 12 against a clamping surface 14 of an electronic chassis 16, with a circuit card retainer 18 comprising a preformed length of spring wire applying a force directed substantially normal to the circuit card 12 and clamping surface 14. Although the specific exemplary embodiments disclosed herein have a clamping surface 14 formed by the chassis 16, it will be understood that, in other embodiments of the invention, the clamping surface could be formed by a variety of other structures, such as a heat sink.

As shown in FIGS. 2 and 3, the exemplary embodiment of the circuit card retainer 18 is a length of spring wire defining a longitudinal axis 20 of the retainer 18. The spring wire and the longitudinal axis 20 lie in a plane 22 of the retainer 18, as illustrated in FIG. 3. A portion of the length of spring wire is formed to define a wavy section 24 of the retainer 18, having peaks 26 and valleys 28 of the spring wire lying in the plane 22 of the retainer 18. At least some of the peaks 26 and/or the valleys 28 of the wavy section 24 are offset from the axis 20 of the retainer 18. Specifically, in the exemplary embodiment shown in FIGS. 2 and 3, the peaks 26 are offset from the axis 20 of the retainer 18, and the valleys 28 lie along the axis 20 of the retainer 18. In other embodiments of the invention, it may be desirable to have the peaks 26 and valleys 28 offset on opposite sides of the axis 20 of the retainer 18. The peaks 26 and valleys 28 are also regularly spaced from one other in the wavy section 24 of the exemplary embodiment of the retainer 18, but it is understood that in other embodiments of the invention the peaks 26 and valleys 28 need not be equally spaced or have a uniform shape throughout the extent of the wavy section 24. Also, although the peaks 26 and valleys 28 of the exemplary embodiment of the retainer 18 have a generally radiused profile, in other embodiments of the invention other profiles such as trapezoidal may be used.

As further shown in FIGS. 2 and 3, the circuit card retainer 18 of the exemplary embodiment includes a straight section 30 of the spring wire, extending substantially parallel to the axis 20 at one end of the wavy section 24 of the retainer 18. The retainer 18 further includes a stop section 32 of the spring wire, extending substantially perpendicular to the axis 20 at the opposite end of the wavy section 24 of the retainer 18. As shown in FIG. 3, the stop section 32 of the retainer 18 in the exemplary embodiment also lies in the plane 22 of the retainer 18. As will be understood by those having skill in the art, in light of the description below and drawings, the stop section 32 may be orientated obliquely to the axis 20 in other embodiments of the invention, and may lie out of the plane 22 of the retainer 18 in other embodiments of the invention.

Figure 4:
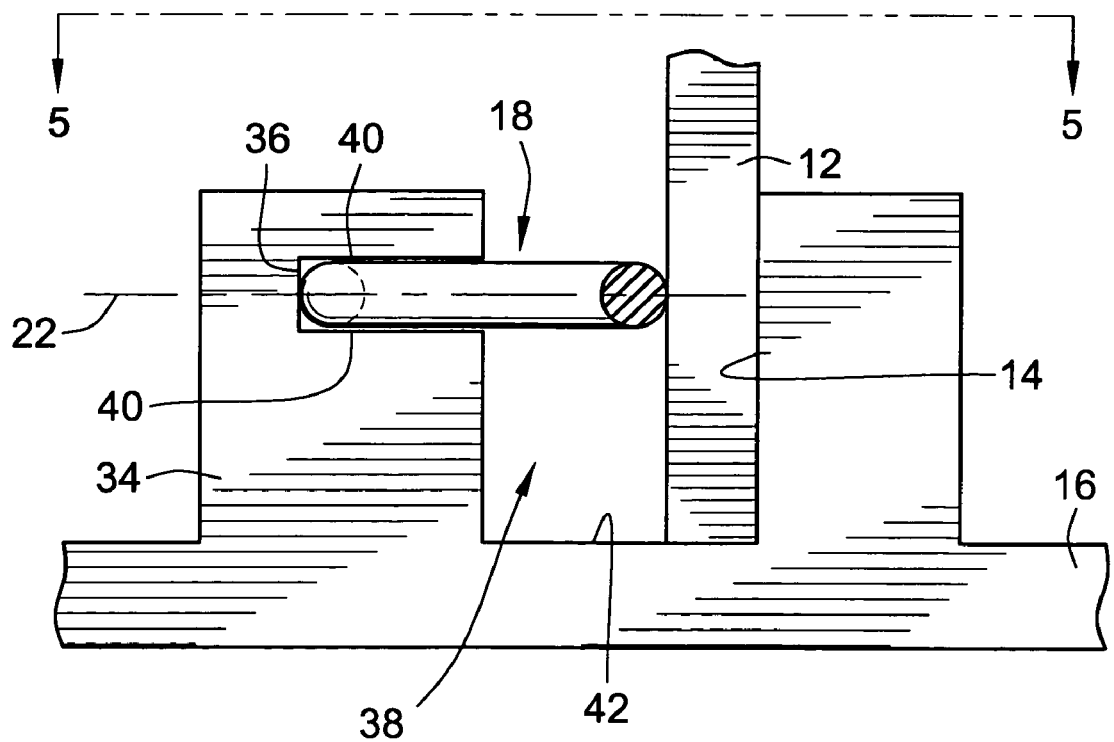
FIG. 4 is an enlarged cross section of a portion of the apparatus shown in FIG. 1.
Figure 5:
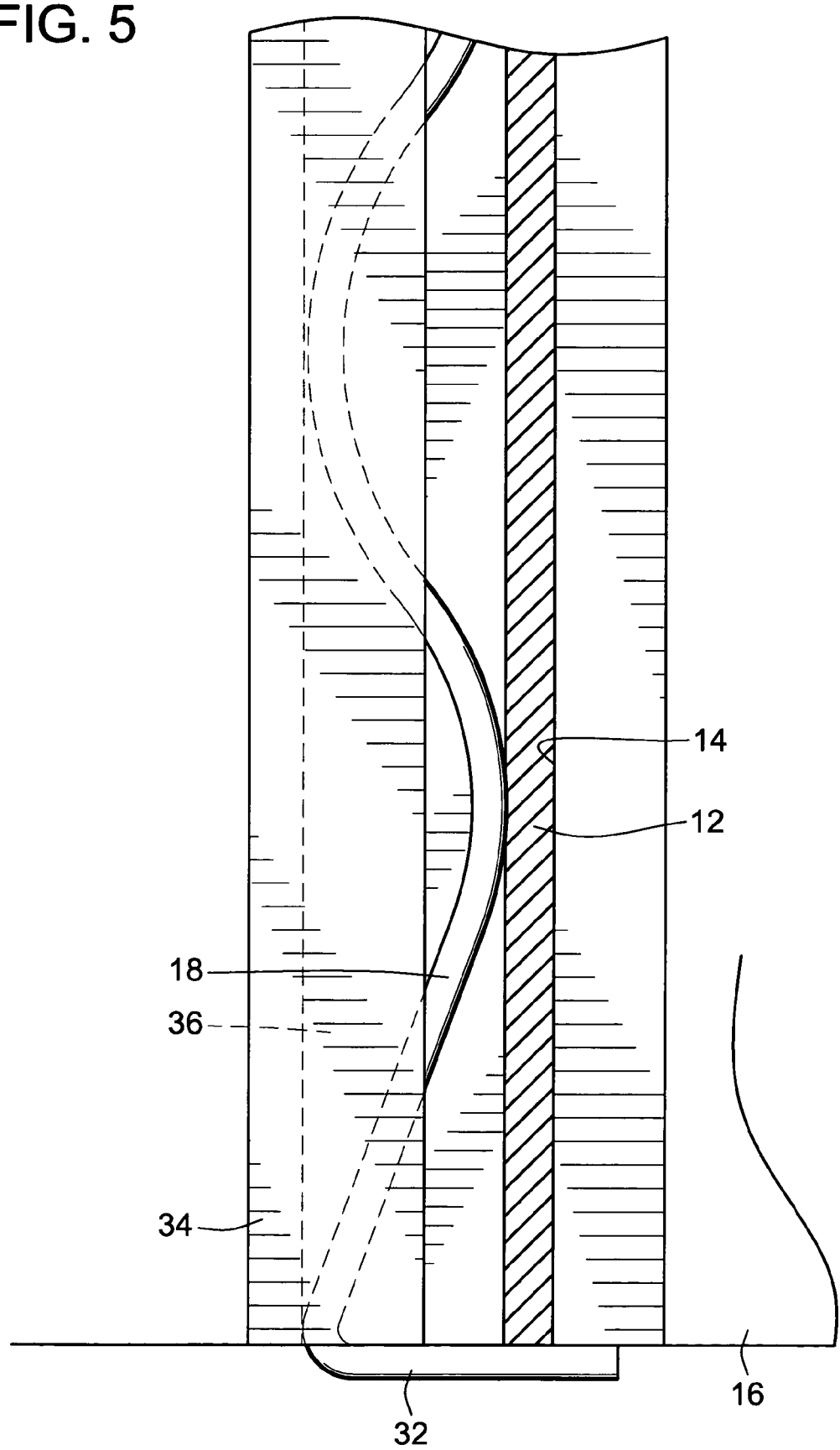
FIG. 5 is a top view of the portion of the apparatus shown in FIG. 4, taken along lines 5-5 as shown in FIG. 4.

As shown in FIGS. 1, 4 and 5, the exemplary embodiment of an apparatus 10, according to the invention, further includes a retainer guide 34 having a groove 36 therein for receiving and orientating the plane 22 of the retainer 18 substantially perpendicular to the circuit card 12 and clamping sureface 14.

It is preferred that the straight section 30 of the retainer 18 have a length that is longer than the length of the groove 36 in the retainer guide 34, so that the straight section 30 of the retainer 18 can be easily fed through the length entire of the groove 36 when installing the retainer 18 into the groove 36.

Specifically, in practicing a method according to the invention, an edge of the circuit card 12 is inserted into a card receiving channel 38 between the clamping surface 14 and the retainer guide 34. The straight section 30 of the retainer 18 is then fed through the groove 36 in the retainer guide 34 to a point where the leading end of the straight section protrudes from the opposite end of the groove 36. The protruding end of the straight section 30 is then grasped by hand or with a pliers or other suitable instrument, and the wavy section 24 of the retainer 18 is pulled into the groove 36 to a point where the stop 32 contacts the end of the retainer guide 34, or another surface of the chassis 16. The portion of the retainer 18 protruding from the end of the groove 36 opposite of the stop 32 may then be cut off flush with the end of the groove 36, or bent over the end of the retainer guide 34 and then cut, to secure the retainer 18 within the groove 36.

As shown in FIGS. 2 and 2a, the straight section 30 of the retainer 18 of the exemplary embodiment also includes a snap-off constriction, in the form of notch 31, so that the straight section 30 of the retainer 18 may be snapped off, without the use of a tool, by bending the retainer 18 at the notch 31, after the retainer 18 is pulled into place in the groove 36. Although the notch 31 is shown as having a square-cornered configuration in the exemplary embodiments, in other embodiments of the invention, the snap-off constriction may be V-shaped or U-shaped, and may include multiple notches, or extend completely around the perimeter of the retainer. The snap-off constriction may also be located in the retainer in the wavy section, rather than in the straight section.

As shown in FIGS. 4 and 5, the groove 36 in the retainer guide 34 includes a pair of side walls 40 which are spaced apart a distance slightly greater than the cross section of the spring wire of the retainer 18. The opposing faces of the clamping surface 14 and the retainer guide 34 extend generally perpendicularly outward from a datum surface 42 at the bottom of the card receiving channel 38. The side walls 40 of the groove 36 extend into the retainer guide 34 in a direction substantially parallel to the datum 42 and sufficiently deeply into the retainer guide 34 that the groove 36 orients the plane 22 of the retainer 18 substantially parallel to the datum surface 42, and the consequently also substantially perpendicular to the circuit card 12 and the clamping surface 14. It is contemplated that configuring the side walls 40 of the groove 36 to provide a depth of about one half of the distance between the crests of adjacent peaks 26 and valleys 28 of the retainer will be preferred, but not necessarily required, to support the retainer 18 substantially perpendicular to the circuit card 12, in practicing the invention.

Should it be necessary to pull the retainer 18 back out of the groove 36, the stop section 32 may also be grasped with a pliers, or other suitable tool, so that the retainer 18 can be pulled out, even if the opposite end of the retainer has been cut off or broken off flush with the end or the groove 36.

It will be noted that in the exemplary embodiment described above, the retainer 18 is formed from spring wire having a circular cross section. In other embodiments of the invention, however, the spring wire may have other cross section such as square, rectangular, oval, or other symmetrical or asymmetrical geometric shapes. It is contemplated that suitable materials for forming a retainer, according to the invention, include, but are not limited to, stainless steel, spring steel, spring copper alloys, or reinforced plastics, with the term wire including both metallic and non-metallic materials.

Figure 6:
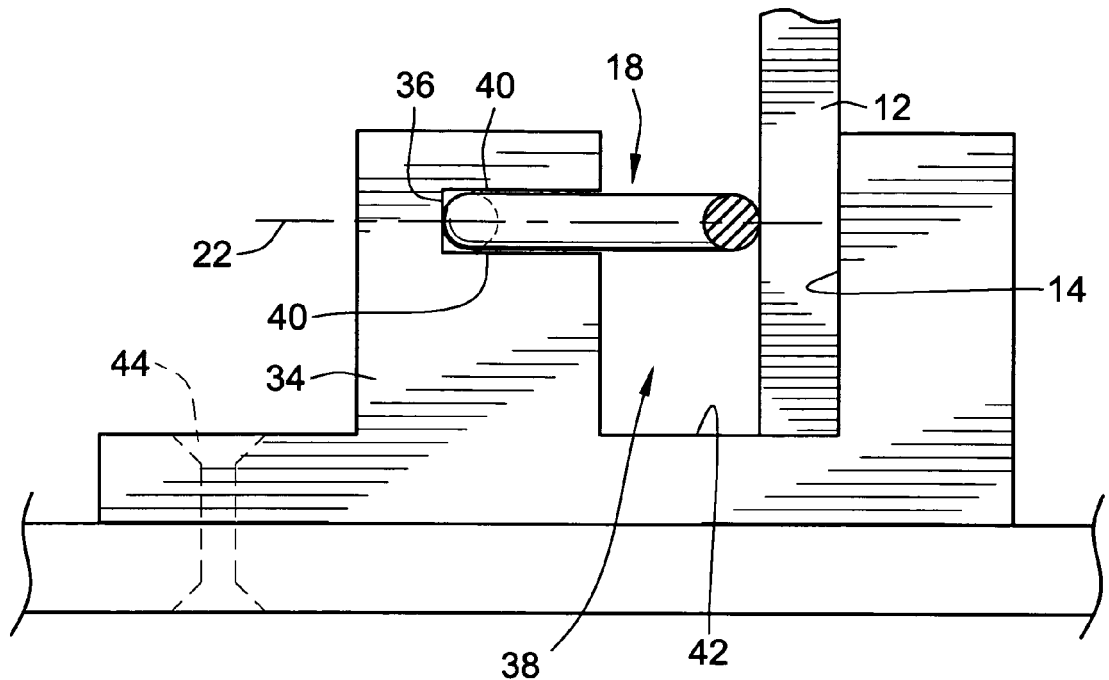
FIG. 6 is an enlarged cross section of an alternate embodiment of an apparatus, according to the invention, showing a retainer guide attached to a chassis by a fastener such as a rivet.
Figure 7:
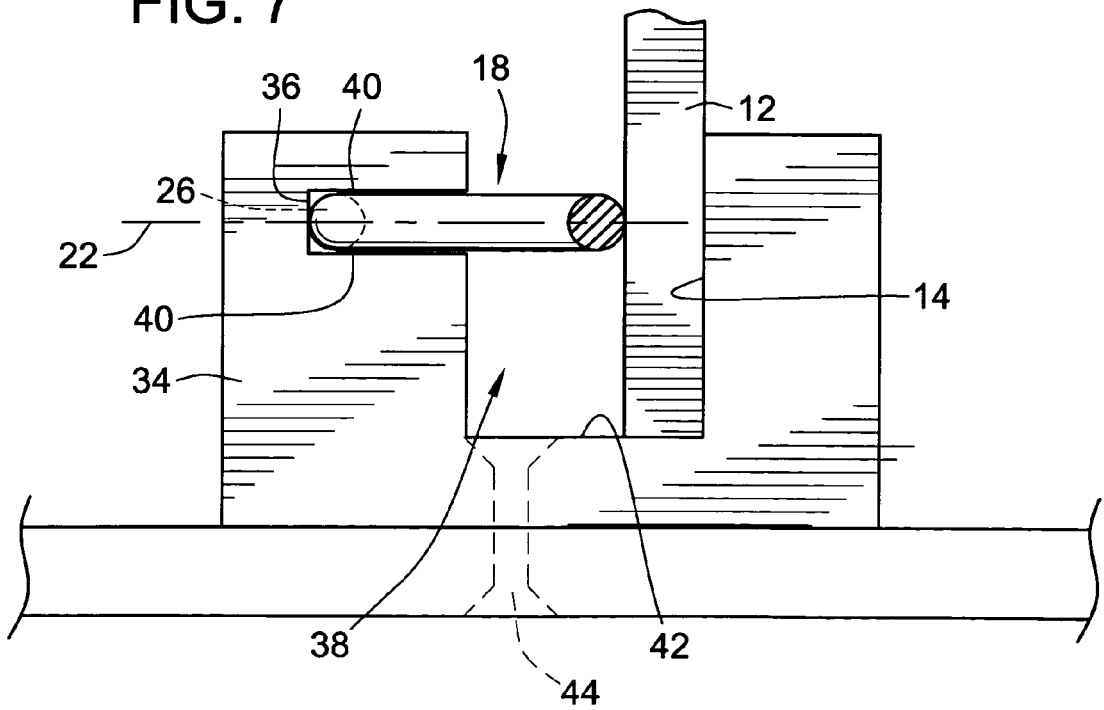
FIG. 7 is an enlarged cross section of the alternate embodiment of the invention having a card receiving channel formed by a U-shaped component providing a retainer guide and a clamping surface, according the invention.

It will also be noted that in the exemplary embodiment 10 of the apparatus according to the invention, both the clamping surface 14 and the retainer guide 34 were formed as integral parts of the chassis 16. As shown in FIG. 6, in alternate embodiments of the invention, the retainer guide 34 may be formed as a separate part of the apparatus 10 and attached to the chassis 16 by various means, such as the rivet 44 shown in FIG. 6 or other appropriate methods. Alternatively, as shown in FIG. 7, in some embodiments of the invention it maybe desirable to have the retainer guide 34 and clamping surface 14 formed as a separate U shaped channel 46 which is attached to the chassis 16 by suitable method such as brazing, riveting or with fasteners such as screws.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A circuit card retainer comprising a length of spring wire defining a longitudinal axis of the retainer, lying in a plane of the retainer, and formed to define a wavy section of the retainer having peaks and valleys of the spring wire lying in the plane of the retainer with at least some of the peaks and the valleys being offset from the longitudinal axis of the retainer, and a snap-off constriction adapted to snap-off a length of the spring wire to make the spring wire shorter.

2. The retainer of claim 1, further comprising a straight section of the spring wire extending substantially parallel to the longitudinal axis at one end of the wavy section of the retainer.

3. The retainer of claim 1, further comprising a stop section of the spring wire extending substantially perpendicular to the longitudinal axis at an opposite end of the wavy section of the retainer.

4. The retainer of claim 3, wherein the stop section lies in the plane of the retainer.

5. The retainer of claim 1, wherein the peaks and valleys are regularly spaced in the wavy section.

6. A circuit card retainer comprising a length of spring wire defining a longitudinal axis of the retainer, lying in a plane of the retainer, and formed to define a wavy section of the retainer having peaks and valleys of the spring wire lying in the plane of the retainer with at least some of the peaks and the valleys being offset from the longitudinal axis of the retainer, a straight section of the spring wire extending substantially parallel to the longitudinal axis at one end of the wavy section of the retainer, and wherein the straight section includes a snap-off constriction adapted to snap-off a length of the spring wire to make the spring wire shorter.

7. The retainer of claim 6, further comprising a stop section of the spring wire extending substantially perpendicular to the longitudinal axis at an opposite end of the wavy section of the retainer.

8. The retainer of claim 7, wherein the stop section lies in the plane of the retainer.

9. A circuit card retainer comprising a length of spring wire defining a longitudinal axis of the retainer, lying in a plane of the retainer, and formed to define a wavy section of the retainer having peaks and valleys of the spring wire lying in the plane of the retainer with at least some of the peaks and the valleys being offset from the longitudinal axis of the retainer, a straight section of the spring wire extending substantially parallel to the longitudinal axis at one end of the wavy section of the retainer, a stop section of the spring wire extending substantially perpendicular to the longitudinal axis at an opposite end of the wavy section of the retainer, and a snap-off constriction adapted to snap-off a length of the spring wire to make the spring wire shorter.

* * * * *